United States Patent
Yuan et al.

(10) Patent No.: US 11,200,861 B2
(45) Date of Patent: Dec. 14, 2021

(54) SHIFT REGISTER UNIT, GATE DRIVE CIRCUIT, DISPLAY PANEL AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/000,219

(22) Filed: Aug. 21, 2020

(65) Prior Publication Data

US 2021/0090518 A1 Mar. 25, 2021

(30) Foreign Application Priority Data

Sep. 25, 2019 (CN) .......................... 201910910927.1

(51) Int. Cl.
*G09G 3/36* (2006.01)
*G09G 3/3266* (2016.01)
*G11C 19/28* (2006.01)

(52) U.S. Cl.
CPC ......... *G09G 3/3677* (2013.01); *G09G 3/3266* (2013.01); *G11C 19/28* (2013.01); *G09G 2310/0286* (2013.01)

(58) Field of Classification Search
CPC ......... G09G 3/3677; G09G 2310/0286; G09G 3/3266; G11C 19/28
See application file for complete search history.

(56) References Cited

U.S. PATENT DOCUMENTS 6,556,646 B1 4/2003 Yeo et al.
2018/0046048 A1* 2/2018 Zhao ...................... G11C 19/28
(Continued)

FOREIGN PATENT DOCUMENTS

CN 106228927 A 12/2016
CN 106652875 A 5/2017
(Continued)

OTHER PUBLICATIONS

First Office Action dated Mar. 22, 2021 issued by CNIPA for the parallel Chinese patent application No. 201910910927.1.

*Primary Examiner* — Xuemei Zheng
(74) *Attorney, Agent, or Firm* — Kinney & Lange, P.A.

(57) ABSTRACT

A shift register unit includes a pull-down sustaining sub-circuit and a pull-down sub-circuit. The pull-down sustaining sub-circuit includes: a first transistor having a control electrode configured to input a pull-down sustaining signal, a first electrode connected to a first power signal terminal, and a second electrode connected to a pull-down node; a first capacitor; and a second transistor having a control electrode connected to an input signal terminal. The pull-down sub-circuit includes: a third transistor having a control electrode connected to the first terminal of the first capacitor, a first electrode connected to a pull-up node, and a second electrode connected to the second power signal terminal; a fourth transistor having a control electrode connected to the first terminal of the first capacitor, a first electrode connected to an output sub-circuit, and a second electrode connected to the second power signal terminal.

16 Claims, 8 Drawing Sheets

(56) References Cited

U.S. PATENT DOCUMENTS

2018/0122289 A1    5/2018   Gu et al.
2018/0174545 A1*   6/2018   Li .................... G09G 3/3648
2020/0168162 A1    5/2020   Feng et al.

FOREIGN PATENT DOCUMENTS

CN      108288451 A    7/2018
CN      109935185 A    6/2019

* cited by examiner

SHIFT REGISTER UNIT, GATE DRIVE CIRCUIT, DISPLAY PANEL AND DISPLAY DEVICE

CROSS-REFERENCE TO RELATED APPLICATION(S)

The present application claims priority to Chinese Patent Application No. 201910910927.1, filed on Sep. 25, 2019, and titled "Gate drive circuit, pixel circuit, display panel and display device," the entire disclosure of which is incorporated herein by reference.

TECHNICAL FIELD

The present disclosure relates to the field of display technology, and in particular to a shift register unit, a gate drive circuit, a display panel, and a display device.

BACKGROUND

A liquid crystal display is generally composed of a vertical and horizontal array type pixel matrix. During the display process, gate drive signals are output through shift register units, and pixels are scanned row by row.

In the related art, the shift register unit needs an inverter to control the potential of the pull-down node PD. Therefore, a large number of TFTs (Thin Film Transistors) need to be used to form the inverter. It is not conducive to the narrow bezel and high PPI (Pixels Per Inch, the number of pixels per inch) display of the oxide backplane. At the same time, the operation of the inverter is affected by the turn-on voltage Vth of the TFT, and the TFT (especially the TFT of the oxide process) is prone to negative drift (that is, zero point shift), resulting in a smaller working range of the circuit and lower reliability.

SUMMARY

The embodiment of the first aspect of the present disclosure provides a shift register unit, comprising:

a pull-down sustaining sub-circuit comprising:

a first transistor having a control electrode configured to input a pull-down sustaining signal, a first electrode connected to a first power signal terminal, and a second electrode connected to a pull-down node;

a first capacitor having a first terminal connected to the second electrode of the first transistor, and a second terminal connected to a second power signal terminal; and a second transistor having a control electrode connected to an input signal terminal, a first electrode connected to the first terminal of the first capacitor, and a second electrode connected to the second power signal terminal;

a pull-down sub-circuit comprising:

a third transistor having a control electrode connected to the first terminal of the first capacitor, a first electrode connected to a pull-up node, and a second electrode connected to the second power signal terminal; and a fourth transistor having a control electrode connected to the first terminal of the first capacitor, a first electrode connected to an output sub-circuit, and a second electrode connected to the second power signal terminal.

According to an embodiment of the present disclosure, the pull-down sustaining signal is a third clock signal or a reset signal.

According to an embodiment of the present disclosure, the shift register unit further comprises:

a set sub-circuit, connected to the input signal terminal, the first power signal terminal and the pull-up node, and configured to output a first power signal of the first power signal terminal to the pull-up node under the control of an input signal of the input signal terminal;

the output sub-circuit, connected to the pull-up node, a first clock signal terminal and an output terminal, and configured to output an output signal at the output terminal under the control of the pull-up node; and a reset sub-circuit, connected to a reset signal terminal, the pull-up node and the second power signal terminal, and configured to output a second power signal of the second power signal terminal to the pull-up node under the control of a reset signal of the reset signal terminal.

According to an embodiment of the present disclosure, the pull-down sustaining sub-circuit further comprises: a fifth transistor through which the second electrode of the second transistor being connected to the second power signal terminal, the fifth transistor having a control electrode connected to the control electrode of the second transistor, a first electrode connected to the second electrode of the second transistor, and a second electrode connected to the second power signal terminal, According to an embodiment of the present disclosure, the pull-down sub-circuit further comprises: a sixth transistor through which the first electrode of the third transistor being connected to the output sub-circuit, the sixth transistor having a control electrode connected to the control electrode of the third transistor, a first electrode connected to the first electrode of the third transistor, and a second electrode connected to the output sub-circuit, According to an embodiment of the present disclosure, the shift register unit further comprises a feedback sub-circuit, the feedback sub-circuit comprising: a seventh transistor having a control electrode connected to the pull-up node, a first electrode connected to the first power signal terminal, and a second electrode connected to the first electrode of the third transistor.

According to an embodiment of the present disclosure, the reset sub-circuit comprises: an eighth transistor having a control electrode connected to the reset signal terminal, a first electrode connected to the control electrode of the seventh transistor, and a second electrode connected to the second electrode of the seventh transistor, the second electrode of the eighth transistor being connected to the second power signal terminal.

According to an embodiment of the present disclosure, the reset sub-circuit further comprises: a ninth transistor through which the second electrode of the eighth transistor being connected to the second power signal terminal, the ninth transistor having a control electrode connected to the control electrode of the eighth transistor, a first electrode connected to the second electrode of the eighth transistor, and a second electrode connected to the second power signal terminal.

According to an embodiment of the present disclosure, the output sub-circuit comprises: a tenth transistor having a control electrode connected to the control electrode of the seventh transistor and the second electrode of the sixth transistor respectively, a first electrode connected to the first clock signal terminal, and a second electrode connected to the first electrode of the fourth transistor, the second electrode of the tenth transistor being configured to output the output signal; a second capacitor having a first terminal connected to the control electrode of the tenth transistor, and a second terminal connected to the second electrode of the tenth transistor.

According to an embodiment of the present disclosure, the set sub-circuit comprises: an eleventh transistor having a control electrode connected to the input signal terminal, a first electrode connected to the first power signal terminal, and a second electrode connected to the control electrode of the tenth transistor.

According to an embodiment of the present disclosure, the shift register unit further comprises: a feedback sub-circuit, a reset sub-circuit, and a set sub-circuit, the feedback sub-circuit comprises:

a seventh transistor having a control electrode connected to the pull-up node, a first electrode connected to the first power signal terminal, and a second electrode connected to the first electrode of the third transistor, the reset sub-circuit comprises:

an eighth transistor having a control electrode connected to the reset signal terminal, a first electrode connected to the control electrode of the seventh transistor, and a second electrode connected to the second electrode of the seventh transistor, the second electrode of the eighth transistor being connected to the second power signal terminal, the output sub-circuit comprises:

a tenth transistor having a control electrode connected to the control electrode of the seventh transistor and the second electrode of the sixth transistor respectively, a first electrode connected to the first clock signal terminal, and a second electrode connected to the first electrode of the fourth transistor, the second electrode of the tenth transistor being configured to output the output signal;

a second capacitor having a first terminal connected to the control electrode of the tenth transistor, and a second terminal connected to the second electrode of the tenth transistor, the set sub-circuit comprises:

an eleventh transistor having a control electrode connected to the input signal terminal, a first electrode connected to the first power signal terminal, and a second electrode connected to the control electrode of the tenth transistor.

To achieve the above objective, the embodiment of the second aspect of the present disclosure provides a gate drive circuit comprising: a plurality of shift register units described in the embodiment of the first aspect of the present disclosure, which are cascaded, wherein, the input signal terminal of each shift register unit except first stage shift register unit is connected to the output signal terminal of a previous stage shift register unit; the reset signal terminal of each shift register unit except last two stage shift register units is connected to the output signal terminal of a next-but-one stage shift register unit.

According to an embodiment of the present disclosure, the input signal terminal of the first stage shift register unit receives a STV (Start) signal.

The embodiment of the third aspect of the present disclosure provides a display panel, comprising the gate drive circuit described in the embodiment of the second aspect of the present disclosure and a drive circuit.

The fourth aspect of the present disclosure provides a display device, comprising the display panel described in the embodiment of the third aspect of the present disclosure and a housing.

The fifth aspect of the present disclosure provides a control method of the shift register unit of the first aspect of the present disclosure, comprising:

in a first phase, inputting, at the input signal terminal, an input signal of a turn-on level;

in a second phase, inputting, at the input signal terminal, an input signal of a turn-off level, and inputting, at the first clock signal terminal, a signal of a turn-on level; and in a third phase, inputting, at the reset signal terminal, the reset signal of a turn-on level, and inputting the pull-down sustaining signal of a turn-on level.

BRIEF DESCRIPTION OF THE DRAWINGS

The foregoing and/or additional aspects and advantages of the present disclosure will be apparent and readily appreciated from the following description of the embodiments in connection with the accompanying drawings, in which.

DETAILED DESCRIPTION

Figure 1:
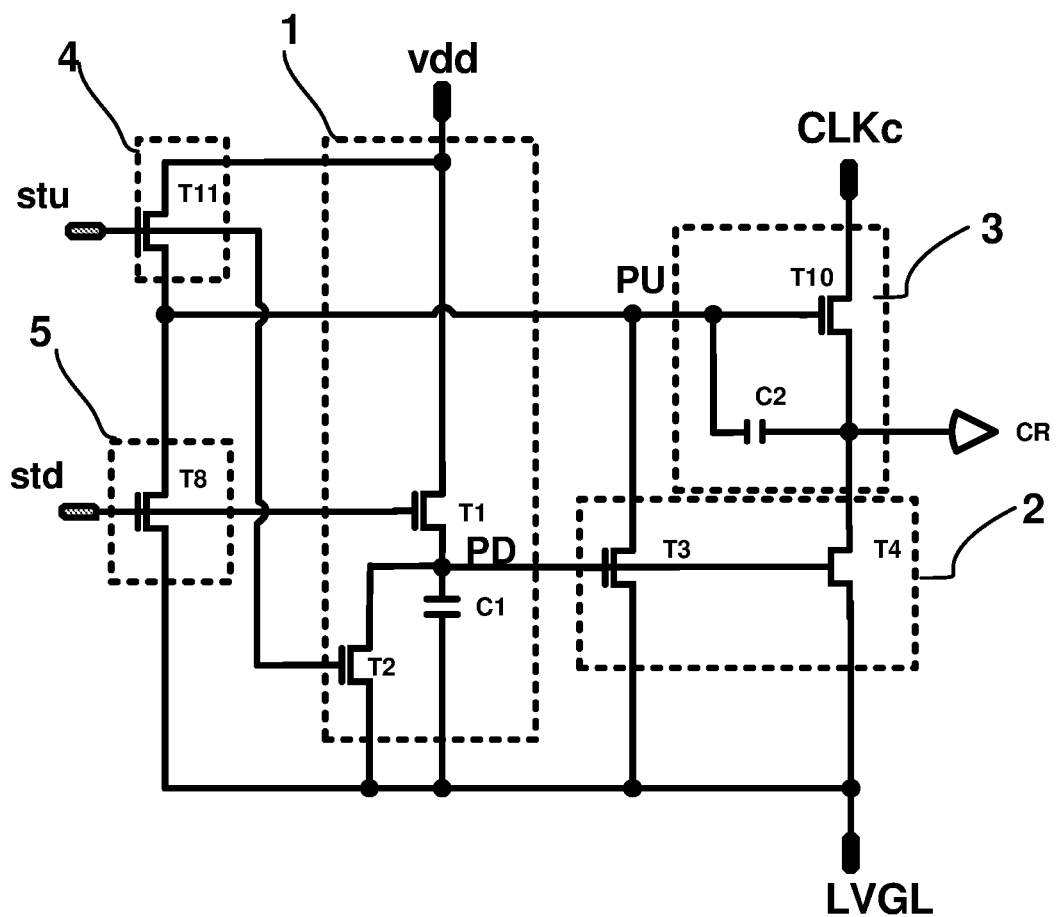
FIG. 1 is a schematic structural diagram of a shift register unit according to an embodiment of the present disclosure.

Hereinafter, embodiments of the present disclosure will be described in detail. Examples of the embodiments are shown in the accompanying drawings, wherein the same or similar reference numerals represent the same or similar elements or elements having the same or similar functions throughout. The embodiments described hereinafter with reference to the accompanying drawings are exemplary and are intended to explain the present disclosure and are not to be construed as limiting the present disclosure.

The following describes the shift register unit, the gate drive circuit, the display panel, and the display device provided in the embodiments of the present disclosure with reference to the accompanying drawings.

Figure 3:
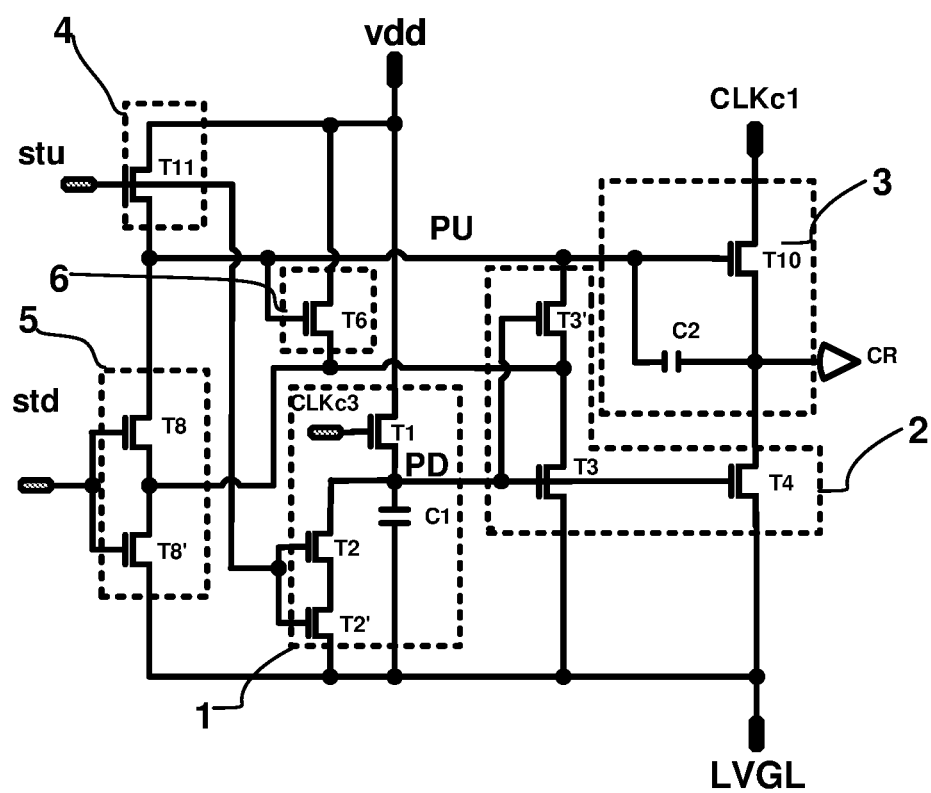
FIG. 3 is a schematic structural diagram of a shift register unit according to another embodiment of the present disclosure.

FIG. 1 is a schematic structural diagram of a shift register unit according to an embodiment of the present disclosure. FIG. 3 is a schematic structural diagram of a shift register unit according to another embodiment of the present disclosure. As shown in FIGS. 1 and 3, the shift register unit includes: a pull-down sustaining sub-circuit 1 and a pull-down sub-circuit 2.

The pull-down sustaining sub-circuit 1 includes: a first transistor T1, a first capacitor C1, and a second transistor T2. The pull-down sub-circuit 2 includes a third transistor T3 and a fourth transistor T4.

The control electrode of the first transistor T1 is configured to input a pull-down sustaining signal, which may be a clock signal (FIG. 3) or a reset signal (FIG. 1). The clock signal may be, for example, the third clock signal of the third clock signal terminal CLKc3 (FIG. 3), and the reset signal may be the signal outputted at the output signal terminal CR of the next-but-one stage shift register unit (if the current shift register unit is the Nth stage, the next-but-one stage shift register unit is the (N+2)th stage) (FIG. 1). The first transistor T1 has a first electrode connected to the first power signal terminal VDD, and a second electrode connected to the pull-down node PD. The first capacitor C1 has a first terminal connected to the second electrode of the first transistor T1, and a second terminal connected to the second power signal terminal LVGL. The second transistor T2 has a control electrode connected to the input signal terminal, which may be connected to the output signal terminal CR of the shift register unit of the previous stage. The second transistor T2 has a first electrode connected to the first terminal of the first capacitor C1, and a second electrode connected to the second power signal terminal LVGL.

The third transistor T3 has a control electrode connected to the first terminal of the first capacitor C1, a first electrode connected to a pull-up node PU, and a second electrode connected to the second power signal terminal LVGL. The fourth transistor T4 has a control electrode connected to the first terminal of the first capacitor C1, a first electrode connected to an output sub-circuit 3, and a second electrode connected to the second power signal terminal LVGL.

Specifically, as shown in FIG. 1, each shift register unit has an input signal terminal (STU), a reset signal terminal (STD), a first power signal terminal (VDD), a first clock signal terminal (CLKc1) and an output signal terminal (CR). The output signal terminal CR of the (N−1)th stage shift register unit may be connected to the input signal terminal STU of the Nth stage shift register unit, and the output signal terminal CR of the (N+2)th stage shift register unit may be connected to the reset signal terminal STD of the Nth stage shift register unit, where N is a positive integer.

The pull-down sustaining signal of each shift register unit may be a clock signal (FIG. 3, CLKc3) or a reset signal (FIG. 1). When T1 is turned on, the first power signal of the first power signal terminal VDD charges the first capacitor C1, and the first capacitor C1 may store the voltage of the pull-down node PD to maintain the potential of the node PD to achieve the purpose of noise reduction.

The difference between FIG. 3 and FIG. 1 lies in that the control electrode of T1 in FIG. 1 is connected to the reset signal terminal STD, and its drive signal is the drive signal output from the next-but-one stage shift register unit, while the drive signal of T1 in FIG. 3 is the third clock signal of the third clock signal terminal CLKc3. The third clock signal is a clock signal with a duty ratio of 1:3, so that the first power signal of the first power signal terminal VDD can charge C1 regularly. Even if the second transistor T2 has a negative drift and causes leakage, the impact on the first capacitor C1 is not significant, and the potential of the node PD can still be effectively maintained. The inventors found through related experiments that when the turn-on voltage of the transistor is within −6V~10V, the shift register unit of the present disclosure can still work normally, and the working range is very large.

The shift register unit of the present disclosure can effectively maintain the potential of the pull-down node PD by using the pull-down sustaining sub-circuit to achieve the purpose of noise reduction. There is no need to add an inverter, therefore the circuit structure is simpler, especially suitable for the narrow frame, high PPI display of the oxide backplane. The circuit is less affected by the negative drift of the transistor, and the working range of the circuit becomes larger.

According to an embodiment of the present disclosure, as shown in FIG. 1 and FIG. 3, the above-mentioned shift register unit may further include: a set sub-circuit 4 and a reset sub-circuit 5. The set sub-circuit 4 is connected to the input signal terminal, the first power signal terminal VDD, and the pull-up node PU, and is configured to output a first power signal of the first power signal terminal VDD to the pull-up node PU under the control of an input signal of the input signal terminal (for example, the output signal output from the previous stage shift register unit). The output sub-circuit 3 is connected to the pull-up node PU, the first clock signal terminal CLKc1 and the output terminal, and is configured to output an output signal at the output terminal CR under the control of the pull-up node PU. The reset sub-circuit 5 is connected to the reset signal terminal, the pull-up node PU and the second power signal terminal LVGL, and is configured to output a second power signal of the second power signal terminal LVGL to the pull-up node PU under the control of a reset signal of the reset signal terminal (for example, the signal output at the output signal terminal of the next-but-one stage shift register unit).

Specifically, as shown in FIG. 1 and FIG. 3, when it inputs at STD a high level reset signal, T1 is turned on (in FIG. 3 when STD is at a high level, CLKc3 is also at a high level), the first power signal of the first power signal terminal VDD is written into the pull-down node PD, and T3 and T4 are turned on. The pull-down sub-circuit 2 applies the low voltage of the second power signal terminal LVGL to the output signal output from the output sub-circuit 3 of the shift register unit. At the same time, the level of the pull-up node PU is maintained at a low level under the control of the level of the pull-down node PD, and the output signal output from the output sub-circuit 3 is maintained at a low level under the control of the level of the pull-down node PD. The pull-down sustaining sub-circuit 1 applies the first power signal of the first power signal terminal VDD to the pull-down node PD to complete the reset operation.

When the set sub-circuit 4 inputs a high level input signal, the first power signal of the first power signal terminal VDD is written into the pull-up node PU. The output sub-circuit 3 outputs an output signal under the control of the level of the pull-up node PU.

In order to make the circuit more reliable, a STT (Series Transistor-Transistor) structure may be used. This structure can make another transistor continue to maintain the normal operation of the circuit when an abnormality occurs in one of the transistors connected in series.

According to an embodiment of the present disclosure, as shown in FIG. 3, the pull-down sustaining sub-circuit 1 may further include a fifth transistor T2', and the second electrode of the second transistor T2 is connected to the second power signal terminal LVGL through the fifth transistor T2'. The fifth transistor T2' has a control electrode connected to the control electrode of the second transistor T2, a first electrode connected to the second electrode of the second transistor T2, and a second electrode connected to the second power signal terminal LVGL.

Specifically, the input signal input at the STU acts on T2 for a long time, which may cause negative drift of T2, thereby causing PD leakage and causing abnormal circuit operation. Therefore, the pull-down sustaining sub-circuit 1 introduces the STT architecture. Even if the negative drift of T2 occurs, T2' can guarantee the potential of PD and ensure the normal operation of the circuit.

According to an embodiment of the present disclosure, as shown in FIG. 3, the pull-down sub-circuit 2 may further include a sixth transistor T3', and the first electrode of the third transistor T3 is connected to the output sub-circuit 3 through the sixth transistor T3'. The sixth transistor T3' has a control electrode connected to the control electrode of the third transistor T3, a first electrode connected to the first electrode of the third transistor T3, and a second electrode connected to the output sub-circuit 3.

Specifically, the pull-down sub-circuit 2 introduces the STT architecture to prevent insufficient writing of the potential of the PU due to the negative drift of T3, and improve the reliability of the circuit operation.

According to an embodiment of the present disclosure, as shown in FIG. 3, the above-mentioned shift register unit may further include a feedback sub-circuit 6, and the feedback sub-circuit 6 includes a seventh transistor T6. The seventh transistor T6 has a control electrode connected to the pull-up node PU, a first electrode connected to the first power signal terminal VDD, and a second electrode connected to the first electrode of the third transistor T3.

Specifically, the feedback sub-circuit 6 can prevent a circuit abnormality caused by insufficient writing of the node PU due to the negative drift of the reset sub-circuit 5 and T3 when the high voltage is written to the node PU.

According to an embodiment of the present disclosure, as shown in FIG. 3, the reset sub-circuit 5 includes an eighth transistor T8. The eighth transistor T8 has a control electrode connected to the reset signal terminal, a first electrode connected to the control electrode of the seventh transistor T6, and a second electrode connected to the second electrode of the seventh transistor T6. The second electrode of the eighth transistor T8 is connected to the second power signal terminal LVGL.

In order to improve the reliability of the circuit, the reset sub-circuit 5 may also use the STT structure. Therefore, the reset sub-circuit 5 may further include a ninth transistor T8'. The second electrode of the eighth transistor T8 is connected to the second power signal terminal LVGL through the ninth transistor T8'. The ninth transistor T8' has a control electrode connected to the control electrode of the eighth transistor T8, a first electrode connected to the second electrode of the eighth transistor T8, and a second electrode connected to the second power signal terminal LVGL.

The reset sub-circuit 5 uses the STT structure, which can prevent the circuit abnormality caused by insufficient writing of the potential of the PU due to the negative drift of T8.

According to an embodiment of the present disclosure, as shown in FIG. 3, the output sub-circuit 3 may include: a tenth transistor T10 and a second capacitor C2. The tenth transistor T10 has a control electrode connected to the control electrode of the seventh transistor T6 and the second electrode of the sixth transistor T3' respectively, a first electrode connected to the first clock signal terminal CLKc1, and a second electrode connected to the first electrode of the fourth transistor T4. The second electrode of the tenth transistor T10 is configured to output the output signal. The second capacitor C2 has a first terminal connected to the control electrode of the tenth transistor T10, and a second terminal connected to the second electrode of the tenth transistor T10.

The set sub-circuit 4 may include an eleventh transistor T11. The eleventh transistor T11 has a control electrode connected to the input signal terminal, a first electrode connected to the first power signal terminal VDD, and a second electrode connected to the control electrode of the tenth transistor T10.

The first power signal of the first power signal terminal VDD may be a high level signal, and the second power signal of the second power signal terminal LVGL may be a low level signal.

The working process of the circuit shown in FIG. 1 and FIG. 3 will be described below in conjunction with specific embodiments.

Figure 2:
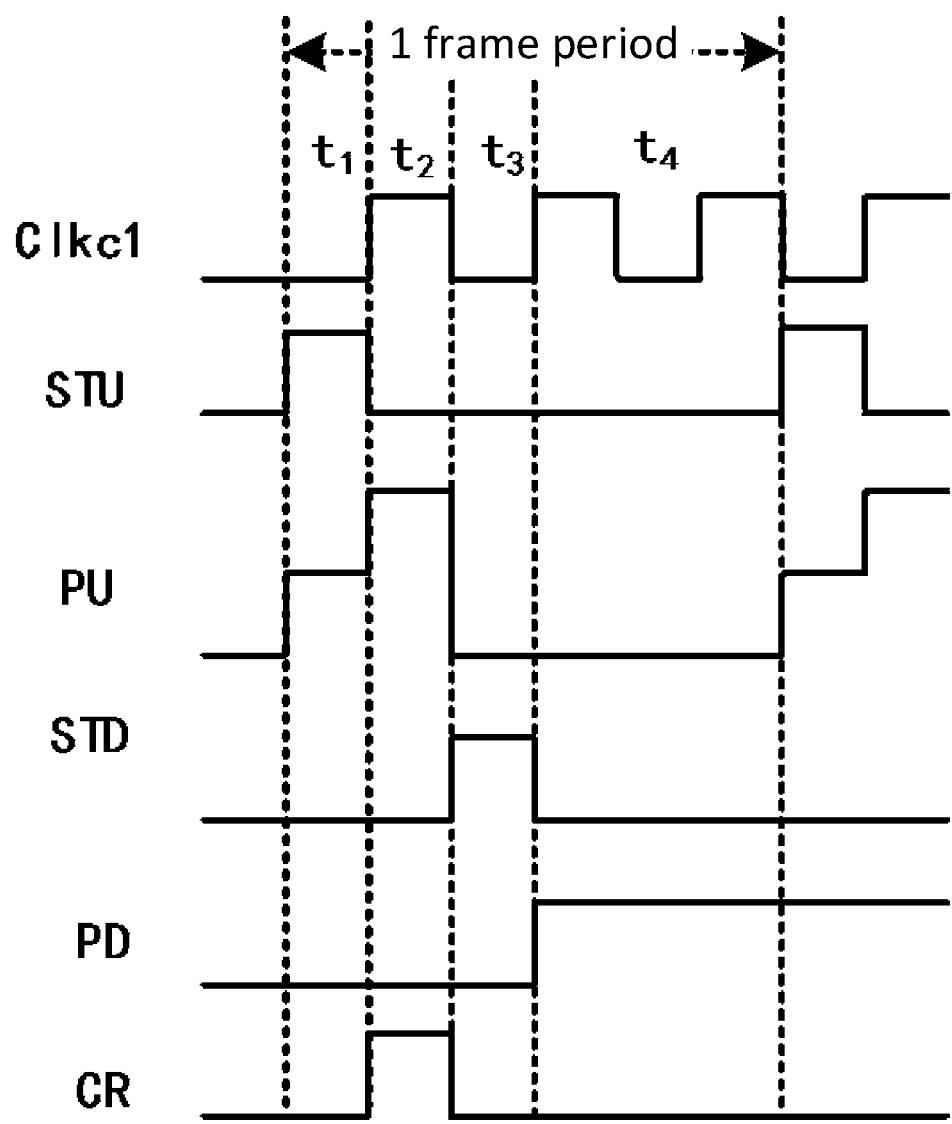
FIG. 2 is a timing diagram of the shift register unit shown in FIG. 1.

FIG. 2 is a timing diagram of the shift register unit shown in FIG. 1. As shown in FIG. 2, the working process of the shift register unit may be divided into: a buffering phase T1, a pull-up phase T2, a pull-down phase T3, and a pull-down holding phase T4.

Buffering phase T1: it inputs at STU a high-level input signal, PD is affected by the high-level input signal input at STU, and the level of PD is pulled down to the low voltage of the second power signal terminal LVGL through T2. T3 and T4 are turned off after the level of the pull-down node PD is pulled down. At the same time, the first power signal of the first power signal terminal VDD charges PU to a high level through T11, and the potential of PD is stably maintained at a low level.

Pull-up phase T2: it inputs at STU a low-level input signal, and inputs at CLKc1 a high-level signal. The high-level signal input at CLKc1 is written to the output terminal CR through T10, and the output terminal CR outputs a high-level output signal. Since the level of the pull-down node PD is low and T3 and T4 are turned off, C2 further pulls up the level of the pull-up node PU to avoid abnormal CR output.

Pull-down phase T3: it inputs at STD a high-level reset signal, and T8 and T1 are turned on. The first power signal of the first power signal terminal VDD is written into PD, and T3 and T4 are turned on. The level of PU is pulled down to the low level of the second power signal terminal LVGL. CR outputs a low level output signal.

Pull-down holding phase T4: The first capacitor C1 holds the pull-down node PD at a high level. Under the control of the voltage of the pull-down node PD, T3 holds the level of the pull-up node PU at the low level of the second power signal terminal LVGL, and T4 keeps the output terminal CR to output a low-level output signal.

Figure 4:
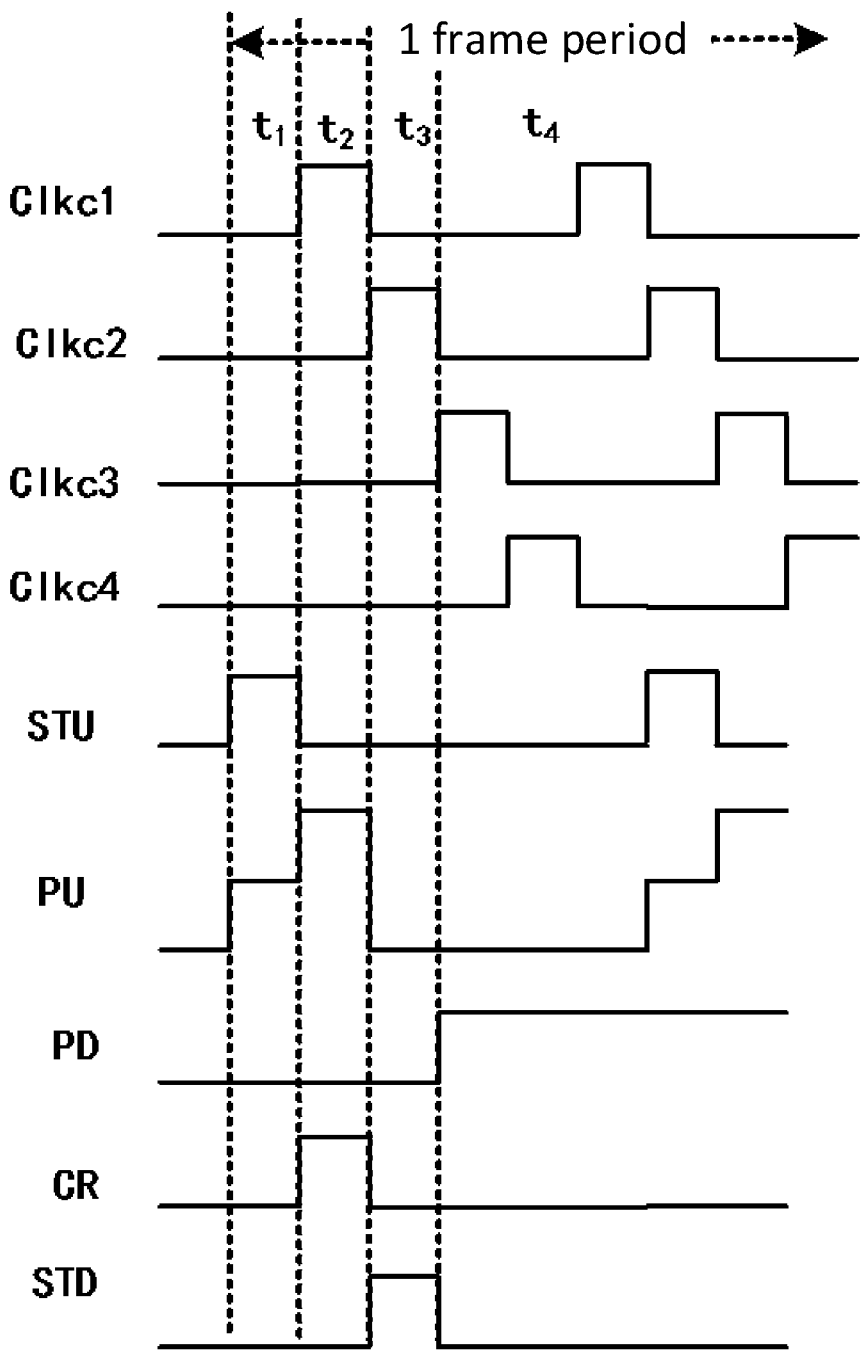
FIG. 4 is a timing diagram of the shift register unit shown in FIG. 3.

FIG. 4 is a timing diagram of the shift register unit shown in FIG. 3. As shown in FIG. 4, the working process of the shift register unit may be divided into: a buffering phase T1, a pull-up phase T2, a pull-down phase T3, and a pull-down holding phase T4.

Buffering phase T1: it inputs at STU a high-level input signal, PD is affected by the high-level input signal output at STU, and the level of the pull-down node PD is pulled down to the low level of the second power signal terminal LVGL through T2 and T2'. T3, T3' and T4 are turned off after the level of the pull-down node PD is pulled down. At the same time, the first power signal of the first power signal terminal VDD charges PU through T11. The level of PU is quickly charged to a high level, and the potential of PD is stably maintained at a low level.

Pull-up phase T2: it inputs at STU a low-level input signal, and inputs at CLKc1 a high-level signal. The high-level signal input at CLKc1 is written to the output terminal CR through T10, and the output terminal CR outputs a high-level output signal. Since the level of the pull-down node PD is low and T3, T3' and T4 are turned off, C2 further pulls up the level of the pull-up node PU to avoid abnormal CR output.

Pull-down phase T3: it inputs at STD a high-level reset signal, and inputs at CLKc3 a high-level signal at the same time. T8, T8' and T1 are turned on. The first power signal of the first power signal terminal VDD is written into PD, and T3, T3' and T4 are turned on. The level of PU is pulled down to the low level of the second power signal terminal LVGL. CR outputs a low level output signal.

Pull-down holding phase T4: The first capacitor C1 holds the pull-down node PD at a high level. Under the control of the voltage of the pull-down node PD, T3 and T3' holds the level of the pull-up node PU at the low level of the second power signal terminal LVGL, and T4 keeps the output terminal CR to output a low-level output signal.

In the present disclosure, the transistors may all be thin film transistors or field effect transistors or other devices with the same characteristics. According to the function in the circuit, the transistors used in the embodiments of the present disclosure are mainly switching transistors. Since the source and drain of the switching transistor used herein are symmetrical, the source and drain are interchangeable. In the embodiments of the present disclosure, in order to distinguish the two electrodes of the transistor except the gate, one of the source and drain is called the first electrode, and the other of the source and drain is called the second electrode. The gate is called the control electrode. In addition, the switching transistors used in the embodiments of the present disclosure may be N-type switching transistors. The N-type switching transistor is turned on when the gate is at a high level, and turned off when the gate is at a low level. In other words, for the N-type switching transistor, the high-level voltage is the turn-on voltage, and the low-level voltage is the turn-off voltage. Of course, the switching transistors used in the embodiments of the present disclosure may also be P-type switching transistors. The P-type switching transistor is turned on when the gate is at a low level, and turned off when the gate is at a high level. In other words, for the P-type switching transistor, the low-level voltage is the turn-on voltage, and the high-level voltage is the turn-off voltage.

It should be noted that the timing diagrams shown in FIG. 2 and FIG. 4 are only an example for illustration, and may be different from the actual timing diagrams. For example, in some embodiments, each input/output voltage signal may not be a square wave as shown in FIG. 2 and FIG. 4, but a waveform that jitters slightly over time, or the rising/falling edge of the pulse is not vertical as shown in FIG. 2 and FIG. 4, but has a certain slope change.

The main differences between FIG. 1 and FIG. 3 in the present disclosure include the following.

1. The drive signal of T1 in FIG. 1 is the reset signal input at STD, and the drive signal of T1 in FIG. 3 is the third clock signal of the third clock signal terminal CLKc3. The third clock signal is a clock signal with a duty ratio of 1:3, so that the first power signal of the first power signal terminal VDD can charge C1 at regular intervals. Even if the second transistor T2 has a negative drift and causes leakage, the impact on the first capacitor C1 is not significant, and the potential of PD can still be effectively maintained.

2. The reset sub-circuit 5, the pull-down sustaining sub-circuit 1, and the pull-down sub-circuit 2 in FIG. 3 use the STT structure, which can prevent the abnormality of the circuit caused by the negative drift of the transistor and improve the reliability of the circuit.

3. The feedback sub-circuit 6 is added in FIG. 3, which can prevent the abnormality of the circuit caused by insufficient writing of the node PU due to the negative drift of the transistors in the reset sub-circuit 5 and the pull-down sub-circuit 2 when the high level signal is written to PU, and improve the reliability of the circuit.

In summary, according to the shift register unit of the embodiment of the present disclosure, the pull-down sustaining sub-circuit can effectively maintain the potential of the pull-down node PD to achieve the purpose of noise reduction. There is no need to add an inverter, and therefore the circuit structure is simpler, which is especially suitable for the narrow frame, high PPI display of the oxide backplane. The circuit is less affected by the negative drift of the transistor, and the working range of the circuit becomes larger.

The embodiment of the present disclosure also provides a gate drive circuit, including: a plurality of shift register units described in the above embodiments, which are cascaded.

Figure 5:
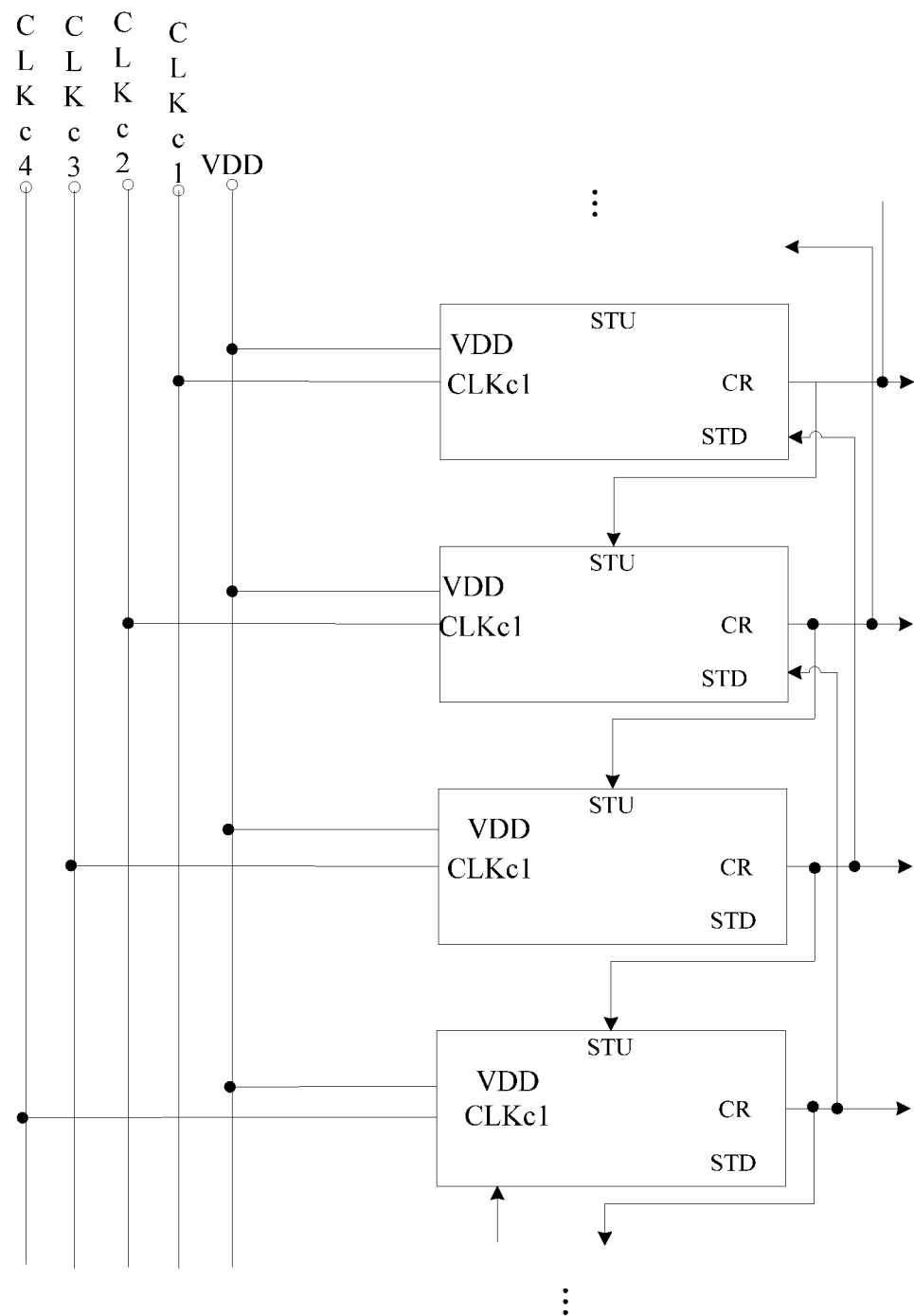
FIG. 5 is a schematic diagram of the cascade of the shift register unit shown in FIG. 1.
Figure 6:
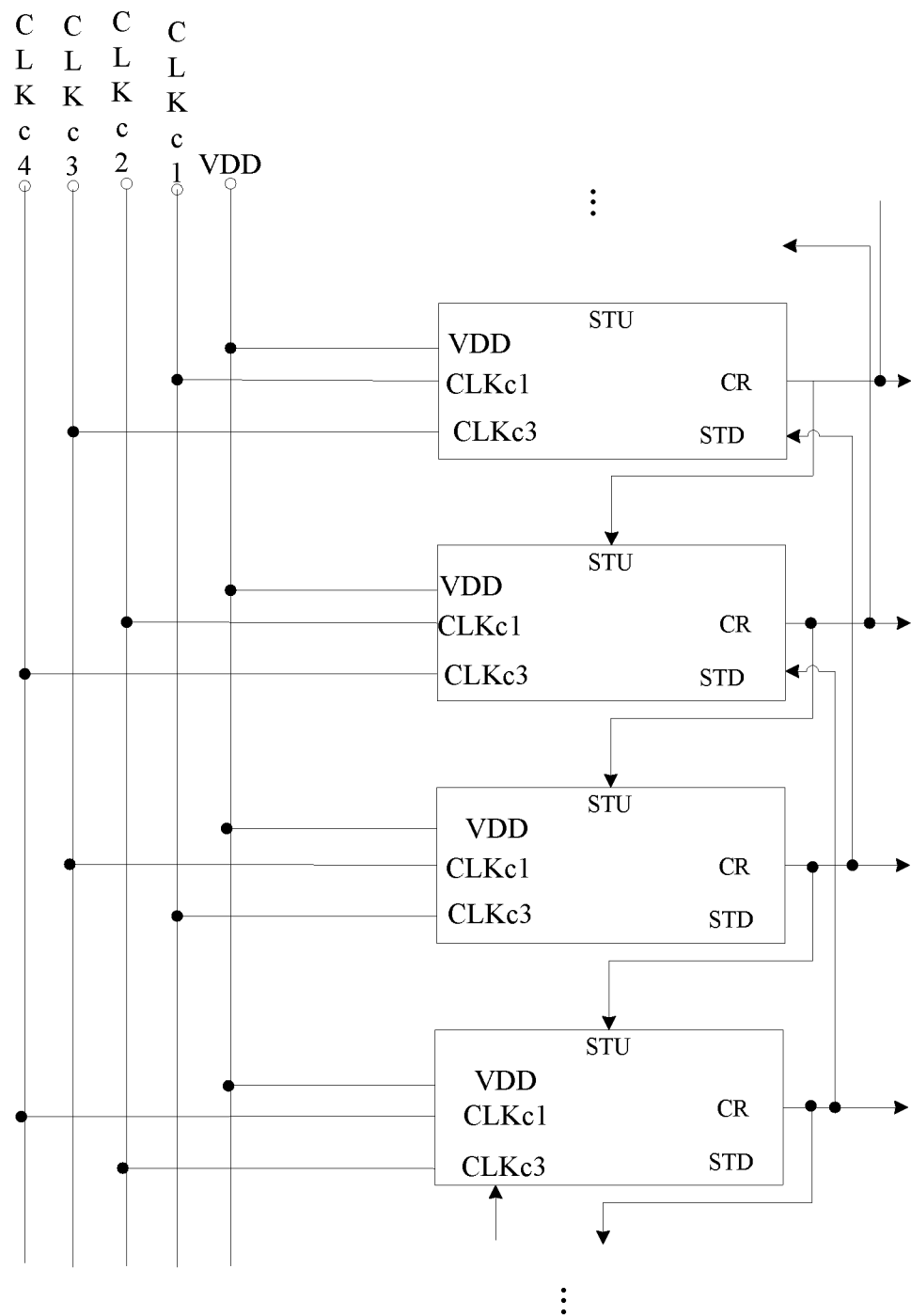
FIG. 6 is a schematic diagram of the cascade of the shift register unit shown in FIG. 3.

FIG. 5 is a schematic diagram of the cascade of the shift register unit shown in FIG. 1. FIG. 6 is a schematic diagram of the cascade of the shift register unit shown in FIG. 3. The clock signals at the CLKc1-CLKc4 terminals are clock signals with a duty ratio of 1:3. The input signal terminal of each shift register unit except the first stage shift register unit is connected to the output signal terminal of the previous stage shift register unit. The reset signal terminal of each shift register unit except shift register units of last two stages is connected to the output signal terminal of the next-but-one stage shift register unit.

As shown in FIG. 4, the clock signals at the CLKc1-CLKc4 terminals are clock signals lagging ¼ cycle in sequence. That is, the third clock signal of CLKc3 lags by ½ cycle with respect to the first clock signal of the CLKc1.

It should be noted that the output terminal CR of the last stage shift register unit may be idle. For the first stage shift register unit, the STU receives a STV signal (Start Signal). For each of the shift register units of the last two stages, an additional idle dummy shift register unit is generally designed to reset it.

According to the gate drive circuit of the embodiment of the present disclosure, the above-mentioned pull-down sustaining sub-circuit of the shift register unit can effectively maintain the potential of the pull-down node PD to achieve the purpose of noise reduction. There is no need to add an inverter, and therefore the circuit structure is simpler, which especially suitable for the narrow frame, high PPI display of the oxide backplane. The circuit is less affected by the negative drift of the transistor, and the working range of the circuit becomes larger.

Figure 7:
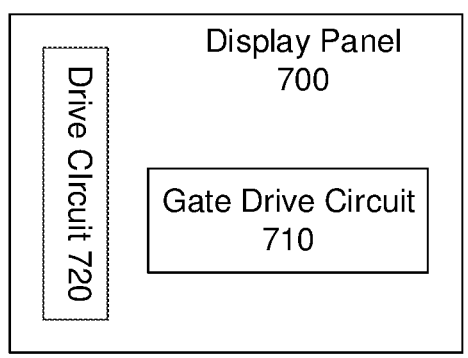
FIG. 7 is a schematic structural diagram of a display panel according to an embodiment of the present disclosure.

In addition, the present disclosure also provides a display panel. As shown in FIG. 7, the display panel 700 includes a gate drive circuit 710 described in the above-mentioned embodiments of the present disclosure and a drive circuit 720. The drive circuit 720 may be configured to provide the gate drive circuit 710 with the STV signal, the clock signals, and the like.

According to the display panel of the embodiment of the present disclosure, the above-mentioned gate drive circuit can effectively maintain the potential of the pull-down node PD to achieve the purpose of noise reduction. There is no need to add an inverter, and therefore the structure is simpler, which is especially suitable for the narrow frame, high PPI display of the oxide backplane. The circuit is less affected by the negative drift of the transistor, and the working range becomes larger.

Figure 8:
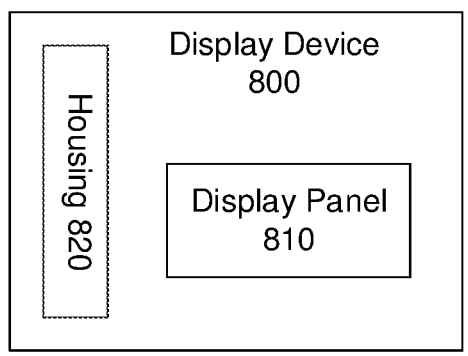
FIG. 8 is a schematic structural diagram of a display device according to an embodiment of the present disclosure.

The fourth aspect of the present disclosure also provides a display device. As shown in FIG. 8, the display device 800 includes a display panel 810 described in the foregoing embodiments of the present disclosure and a housing 820.

The display device of the embodiment of the present disclosure can effectively maintain the potential of the pull-down node PD through the above-mentioned display panel to achieve the purpose of noise reduction. There is no need to add an inverter, and therefore the structure is simpler, which especially suitable for the narrow frame, high PPI display of the oxide backplane. The circuit is less affected by the negative drift of the transistor, and the working range becomes larger.

Figure 9:
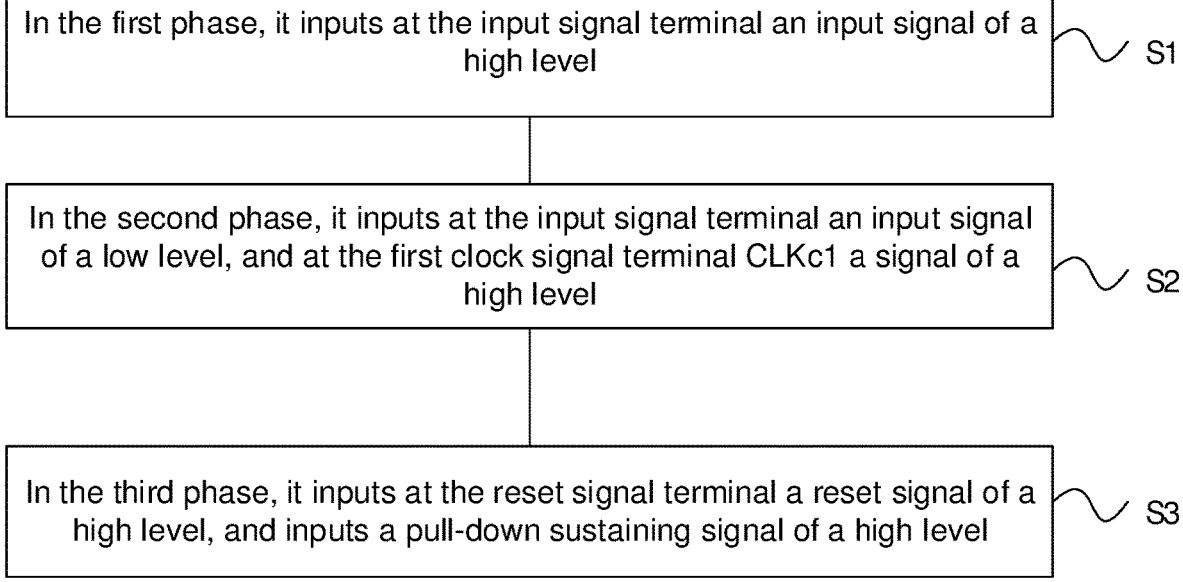
FIG. 9 is a flowchart of a control method of a shift register unit according to an embodiment of the present disclosure.

The fifth aspect of this embodiment also provides a control method of the above-mentioned shift register unit. As shown in FIG. 9, the control method 900 includes the following steps.

Step S1, in the first phase, it inputs at the input signal terminal an input signal of a turn-on level (high level);

Step S2, in the second phase, it inputs at the input signal terminal an input signal of a turn-off level (low level), and it inputs at the first clock signal terminal CLKc1 a signal of a turn-on level (high level); and Step S3: in the third phase, it inputs at the reset signal terminal a reset signal of a turn-on level (high level), and inputs a pull-down sustaining signal of a turn-on level (high level). The control method of the shift register unit provided by the embodiment of the present disclosure is similar to the shift register unit provided above in terms of implementation principles and effects, and will not be repeated here.

In the description of the present disclosure, it should be understood that the orientation or positional relationship indicated by the terms "center", "longitudinal", "transverse", "length", "width", "thickness", "up", "down", "front", "back", "left", "right", "vertical", "horizontal", "top", "bottom", "inner", "outer", "clockwise", "counter-clockwise", "axial", "radial", "circumferential", and the like, is based on the orientation or positional relationship shown in the drawings, and is only for the convenience of describing the present disclosure and simplifying the description, and does not indicate or imply the indicated device or element must have a specific orientation, be constructed and operated in a specific orientation, and therefore cannot be understood as a limitation to the present disclosure.

In addition, the terms "first" and "second" are only used for descriptive purposes, and cannot be understood as indicating or implying relative importance or implicitly indicating the number of indicated technical features. Therefore, defining a feature with "first" and "second" may explicitly or implicitly mean that at least one of the features is included. In the description of the present disclosure, "a plurality of" means at least two, for example, two, three, and the like, unless expressly limited otherwise.

In the present disclosure, unless otherwise clearly specified and limited, the terms "installed", "connected", "coupled", "fixed" and other terms should be understood in a broad sense. For example, these terms may refer to: fixed connections, detachable connections, or integral connections; mechanical connections, or electrical connections; direct connections, or indirect connections through an intermediary; interconnections between two elements, or interactions between two elements, unless expressly limited otherwise. For those of ordinary skill in the art, the specific meanings of the above-mentioned terms in the present disclosure can be understood according to specific circumstances.

In the present disclosure, unless expressly stipulated and defined otherwise, that the first feature is "above"/"below" the second feature may mean that the first and second features are in direct contact, or that the first and second features are in indirect contact through an intermediary. Moreover, that the first feature is "above", "on", "over" the second feature may mean that the first feature is directly above or obliquely above the second feature, or it simply means that the level of the first feature is higher than that of the second feature. That the first feature is "below", "under", "beneath" the second feature may mean that the first feature is directly below or obliquely below the second feature, or it simply means that the level of the first feature is smaller than that of the second feature.

In the description of the present specification, the description of the terms "one embodiment," "some embodiments," "an example," "a specific example," or "some examples" and the like means the specific characteristics, structures, materials, or features described in connection with the embodiment or example are included in at least one embodiment or example of the present disclosure. In the present specification, a schematic expression of the above terms does not necessarily refer to the same embodiment or example. Furthermore, the particular features, structures, materials, or characteristics described may be combined in any suitable manner in any one or more of the embodiments or examples. In addition, different embodiments or examples and features thereof described in this specification may be united and combined by those skilled in the art without mutual contradiction.

Although the embodiments of the present disclosure have been shown and described above, it should be understood that the above embodiments are merely exemplary and should not be construed as limiting the present disclosure. The above embodiments may be changed, modified, replaced, and varied by those skilled in the art within the scope of the present disclosure.

We claim:

1. A shift register unit, comprising:
   a pull-down sustaining sub-circuit comprising:
      a first transistor having a control electrode configured to input a pull-down sustaining signal, a first electrode connected to a first power signal terminal, and a second electrode connected to a pull-down node;
      a first capacitor having a first terminal connected to the second electrode of the first transistor, and a second terminal connected to a second power signal terminal; and
      a second transistor having a control electrode connected to an input signal terminal, a first electrode connected to the first terminal of the first capacitor, and a second electrode connected to the second power signal terminal; and
   a pull-down sub-circuit comprising:
      a third transistor having a control electrode connected to the first terminal of the first capacitor, a first electrode connected to a pull-up node, and a second electrode connected to the second power signal terminal; and
      a fourth transistor having a control electrode connected to the first terminal of the first capacitor, a first electrode connected to an output sub-circuit, and a second electrode connected to the second power signal terminal;
   wherein the pull-down sustaining sub-circuit further comprises:
      a fifth transistor through which the second electrode of the second transistor is connected to the second power signal terminal, the fifth transistor having a control electrode connected to the control electrode of the second transistor, a first electrode connected to the second electrode of the second transistor, and a second electrode connected to the second power signal terminal.

2. The shift register unit of claim 1, wherein the pull-down sustaining signal is a clock signal or a reset signal.

3. The shift register unit of claim 1, further comprising:
a set sub-circuit, connected to the input signal terminal, the first power signal terminal and the pull-up node, and configured to output a first power signal of the first power signal terminal to the pull-up node under the control of an input signal of the input signal terminal;
the output sub-circuit, connected to the pull-up node, a first clock signal terminal and an output terminal, and configured to output an output signal at the output terminal under the control of the pull-up node; and
a reset sub-circuit, connected to a reset signal terminal, the pull-up node and the second power signal terminal, and configured to output a second power signal of the second power signal terminal to the pull-up node under the control of a reset signal of the reset signal terminal.

4. The shift register unit of claim 1, wherein the pull-down sub-circuit further comprises:
a sixth transistor through which the first electrode of the third transistor is connected to the output sub-circuit, the sixth transistor having a control electrode connected to the control electrode of the third transistor, a first electrode connected to the first electrode of the third transistor, and a second electrode connected to the output sub-circuit.

5. The shift register unit of claim 4, further comprising a feedback sub-circuit, the feedback sub-circuit comprising:
a seventh transistor having a control electrode connected to the pull-up node, a first electrode connected to the first power signal terminal, and a second electrode connected to the first electrode of the third transistor.

6. The shift register unit of claim 5, wherein the reset sub-circuit comprises:
an eighth transistor having a control electrode connected to the reset signal terminal, a first electrode connected to the control electrode of the seventh transistor, and a second electrode connected to the second electrode of the seventh transistor, the second electrode of the eighth transistor being connected to the second power signal terminal.

7. The shift register unit of claim 6, wherein the reset sub-circuit further comprises:
a ninth transistor through which the second electrode of the eighth transistor is connected to the second power signal terminal, the ninth transistor having a control electrode connected to the control electrode of the eighth transistor, a first electrode connected to the second electrode of the eighth transistor, and a second electrode connected to the second power signal terminal.

8. The shift register unit of claim 6, wherein the output sub-circuit comprises:
a tenth transistor having a control electrode connected to the control electrode of the seventh transistor and the second electrode of the sixth transistor respectively, a first electrode connected to the first clock signal terminal, and a second electrode connected to the first electrode of the fourth transistor, the second electrode of the tenth transistor being configured to output the output signal; and
a second capacitor having a first terminal connected to the control electrode of the tenth transistor, and a second terminal connected to the second electrode of the tenth transistor.

9. The shift register unit of claim 8, wherein the set sub-circuit comprises:
an eleventh transistor having a control electrode connected to the input signal terminal, a first electrode connected to the first power signal terminal, and a second electrode connected to the control electrode of the tenth transistor.

10. The shift register unit of claim 1, wherein the shift register unit further comprises a feedback sub-circuit, a reset sub-circuit, and a set sub-circuit, wherein:
the feedback sub-circuit comprises:
a seventh transistor having a control electrode connected to the pull-up node, a first electrode connected to the first power signal terminal, and a second electrode connected to the first electrode of the third transistor;
the reset sub-circuit comprises:
an eighth transistor having a control electrode connected to the reset signal terminal, a first electrode connected to the control electrode of the seventh transistor, and a second electrode connected to the second electrode of the seventh transistor, the second electrode of the eighth transistor being connected to the second power signal terminal;
the output sub-circuit comprises:
a tenth transistor having a control electrode connected to the control electrode of the seventh transistor and the second electrode of the sixth transistor respectively, a first electrode connected to the first clock signal terminal, and a second electrode connected to the first electrode of the fourth transistor, the second electrode of the tenth transistor being configured to output the output signal; and
a second capacitor having a first terminal connected to the control electrode of the tenth transistor, and a second terminal connected to the second electrode of the tenth transistor; and
the set sub-circuit comprises:
an eleventh transistor having a control electrode connected to the input signal terminal, a first electrode connected to the first power signal terminal, and a second electrode connected to the control electrode of the tenth transistor.

11. The shift register unit of claim 10, wherein the pull-down sustaining sub-circuit further comprises: a fifth transistor through which the second electrode of the second transistor being connected to the second power signal terminal, the fifth transistor having a control electrode connected to the control electrode of the second transistor, a first electrode connected to the second electrode of the second transistor, and a second electrode connected to the second power signal terminal, wherein:
the pull-down sub-circuit further comprises: a sixth transistor through which the first electrode of the third transistor is connected to the output sub-circuit, the sixth transistor having a control electrode connected to the control electrode of the third transistor, a first electrode connected to the first electrode of the third transistor, and a second electrode connected to the output sub-circuit; and
the reset sub-circuit further comprises: a ninth transistor through which the second electrode of the eighth transistor is connected to the second power signal terminal, the ninth transistor having a control electrode connected to the control electrode of the eighth transistor, a first electrode connected to the second electrode of the eighth transistor, and a second electrode connected to the second power signal terminal.

12. A gate drive circuit comprising a plurality of shift register units of claim 1, which are cascaded, wherein:

the input signal terminal of each shift register unit except a first stage shift register unit is connected to an output signal terminal of a previous stage shift register unit; and a reset signal terminal of each shift register unit except shift register units of a last two stages is connected to an output signal terminal of a next-but-one stage shift register unit.

13. The gate drive circuit of claim 12, wherein the input signal terminal of the first stage shift register unit receives a STV (Start) signal.

14. A display panel, comprising: the gate drive circuit of claim 12 and a drive circuit.

15. A display device comprising: a housing and the display panel of claim 14.

16. A control method of the shift register unit of claim 3, comprising:

in a first phase, inputting, at the input signal terminal, an input signal of a turn-on level;

in a second phase, inputting, at the input signal terminal, an input signal of a turn-off level, and inputting, at the first clock signal terminal, a signal of a turn-on level; and in a third phase, inputting, at the reset signal terminal, the reset signal of a turn-on level, and inputting the pull-down sustaining signal of a turn-on level.

* * * * *